Feb. 17, 1970 N. E. DE VOLDER 3,496,428
DIFFUSION BARRIER FOR SEMICONDUCTOR CONTACTS
Filed April 11, 1968
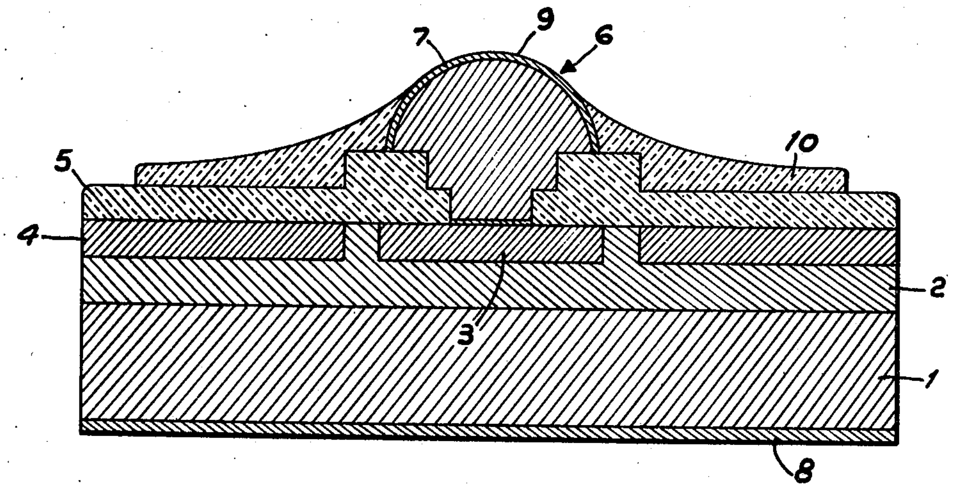
INVENTOR
NORMAN E. DeVOLDER
BY [signature]
ATTORNEY United States Patent Office 3,496,428

Patented Feb. 17, 1970

3,496,428

DIFFUSION BARRIER FOR SEMICONDUCTOR CONTACTS

Norman E. De Volder, North Palm Beach, Fla., assignor to International Telephone and Telegraph Corporation, Nutley, N.J., a corporation of Delaware Filed Apr. 11, 1968, Ser. No. 720,691
Int. Cl. H01h *1/10*
U.S. Cl. 317—234 4 Claims

ABSTRACT OF THE DISCLOSURE

This invention provides a barrier for preventing migration of silver ions from a silver contact on a semiconductor device into a glass layer surrounding the contact which provides a second passivating coating over a first passivating dielectric layer on the surface of the semiconductor device.

BACKGROUND OF THE INVENTION

Semiconductor diodes and transistors for use in various applications such as in computers are made to exacting specifications to assure desired electrical characteristics and to provide precise performance. To retain those characteristics, it is necessary to protect the surfaces about the exposed junctions from conditions which would impair their characteristics or would otherwise damage or destroy the devices. Surface contaminants, moisture and harmful vapors giving rise to chemical attack are detrimental to the proper operation of semiconductor devices. For several years intensive efforts have been expended with germanium and silicon devices, especially the latter, to combat those contaminants by physically or chemically passivating the exposed surfaces of the devices. Those efforts have included the formation of oxides on the surface of the devices or oxides in conjunction with surface treatments to effect an esterification of silanol groups on the device surfaces. Also, physical treatments of those devices have involved encapsulating them in various plastics or combinations of oxides and plastics. Other encapsulating media have included low melting point glasses such as those found in the arsenic-sulphur system and have also included high lead-silicate glasses.

While the various techniques mentioned above have been moderately successful in protecting PN junctions for some purposes they have not proved to be as effective as may be desired for many applications. More particularly, the encapsulating procedures have not afforded adequate or prolonged junction protection in some environments or have resulted in protective jackets that are too bulky for micro-miniaturization purposes.

Heretofore it has been determined that when a thin adherent silicon dioxide film is produced over the exposed PN junction or junctions of a semiconductor device, that junction is passivated and becomes fully protected from the action of junction-impairing contaminants when a thin impervious coating of glass is chemically bonded to the silicon dioxide film. Semiconductor devices with protected PN junctions and the techniques for protecting them with silicon dioxide films and glass coatings chemically bonded thereover are disclosed and claimed in the U.S. Patents 3,247,428; 3,300,841; and 3,323,956. In the manufacture of the semiconductor device, the usual diffusion techniques are performed on the wafer and a silicon dioxide layer is deposited over the wafer to protect the junction, windows being made in the silicon dioxide to provide for contacts to the different regions thereof. Thereafter a glass film or layer is applied to the silicon dioxide by any of several well-known techniques, such as centrifuging, spraying, settling or silk screening; a thin coating of finely divided glass particles followed by a firing process which fuses the particles and forms a continuous hole-free glass layer that is chemically bonded to the silicon dioxide layer. In the application of the glass frit or powder to the surface of the semiconductor wafer, it is necessary to have the glass coating of uniform thickness. If there is non-uniformity in the glass layer thickness, there will occur pin holes. It was found that after the glass layer was fused the high firing temperature (approximately 650° C.) caused degradation in the ohmic contact of the device resulting in a large number of rejects. The glass used has a high affinity for silver and under the influence of high temperature or DC voltage causes instantaneous silver ion migration. The silver ions migrate into the lattice structure of the glass layer and provide a conductive path through the glass layer.

It is therefore an object of this invention to provide a barrier to the migration of silver ions from a silver contact on the semiconductor device to the glass layer surrounding the contact and superimposed above a first passivating dielectric layer.

SUMMARY OF THE INVENTION

This invention provides for the barrier layer surrounding the silver contact device which comprises a nickel plating over the silver contact prior to the deposition of the glass layer and the firing of the glass layer.

DESCRIPTION OF THE INVENTION

The above-mentioned and other features and objects of this invention will become more apparent by reference to the sole figure of this invention which shows a semiconductor diode. Although this invention is described with reference to a semiconductor diode, it is understood that the principles of this invention are equally applicable to diodes, transistors, integrated circuits and other forms of semiconductor devices.

With reference to the sole figure the typical diode, which is one of a plurality of diodes to be made from a semiconductor wafer, is shown having a substrate 1 of N+ conductivity, an N diffused region 2 and a P region 3 constituting region 2 around the P region 3 for isolation purposes. Covering the surface of the chip with the exception of the metal contact area is the silicon dioxide layer 5. The metal contact 6 ordinarily comprises a preliminary metallizing layer of gold nickel on the surface of the P region 3 and silver dot 7 in the shape of a somewhat hemispherical ball alloyed to the metal layer. The back contact 8 is plated on the bottom surface and can for example be tin coated silver. It is to be understood that the diffusion steps and the metallizing steps including the silver dot 7 are performed in accordance with standard techniques of the whole semiconductor wafer to form the plurality of diodes. There is then deposited on the surface of the silver dot 7 a nickel layer 9 which is electrolessly deposited thereon. After the silver dot is plated with the nickel layer 9, there is deposited over the whole surface of the wafer a layer 10 of glass frit which is in the form of a very fine powder to be centrifuged in accordance with known techniques to deposit uniformly over the whole surface of the wafer. The glass that can be used in the process of this invention can be glass referred to in Patent 3,300,841, Corning 7040, a glass manufactured by Corning Glass Works or any other suitable glass which will fuse at a low temperature and has thermal expansion characteristics matching very closely those of silicon semiconductor material. Before firing the glass covered wafer is moved over a fine silk screen mesh to remove the glass from most of the nickel plated silver dot 7. The wafer is then moated as described in a co-pending application of M. B. Bakker-S.A. Swearingen entitled "Method of Manufacturing Semiconductor Devices," filed Apr. 3, 1968, Ser. No. 718,523, assigned to the assignee of this invention. After firing the slice is then scribed and broken into the semiconductor device dice as shown is the sole figure of this invention.

This invention has been described with reference to nickel plating the silver dot 7: nickel is a dense metal, that is the molecules are closely packed and therefore prevents diffusion of silver ion therethrough. Other metals with similar structures and which can be used instead of nickel as a diffusion barrier to silver ion migration are tungsten, molybdenum, platinum, palladium and rhodium. While the process has been described with reference to electroless plating, it is understood that electroplating can also be used.

While I have described above the principles of my invention in connection with specific apparatus, it is to be clearly understood that this description is made only by way of example and not as a limitation to the scope of my invention as set forth in the objects thereof and in the accompanying claims.

I claim:

1. A diffusion barrier for semiconductor contacts comprising:

a semiconductor member having at least one p-n junction therein;

ohmic contacts to both regions of said semiconductor member;

a first dielectric layer on one surface of said semiconductor member;

a conductive barrier diffusion material disposed over the ohmic contact on said surface; and a second dielectric layer disposed over said first dielectric layer and contacting said barrier diffusion matetial.

2. A diffusion barrier for semiconductor contacts according to claim 1 wherein said first dielectric material is silicon dioxide and said second dielectric material is glass.

3. A diffusion barrier for semiconductor contacts according to claim 1 wherein said barrier diffusion material is nickel.

4. A diffusion barrier for semiconductor contacts according to claim 2 wherein said barrier diffusion material is selected from the group consisting of tungsten, molybdenum, platinum, palladium, rhodium.

References Cited

UNITED STATES PATENTS

| | | | |
|---|---|---|---|
| 2,964,831 | 12/1960 | Peterson | 317—234 X |
| 2,972,092 | 2/1961 | Nelson | 317—235 |
| 2,946,935 | 7/1960 | Finn | 317—234 |
| 3,410,736 | 11/1968 | Takuyama et al. | 317—234 |

JAMES D. KALLAM, Primary Examiner

U.S. Cl. X.R.

317—235